(12) United States Patent
Cook et al.

(10) Patent No.: US 8,796,687 B2
(45) Date of Patent: Aug. 5, 2014

(54) TECHNIQUE TO MODIFY THE MICROSTRUCTURE OF SEMICONDUCTING MATERIALS

(75) Inventors: Glen Bennett Cook, Elmira, NY (US); Prantik Mazumder, Ithaca, NY (US); Mallanagouda Dyamanagouda Patil, Corning, NY (US); Lili Tian, Corning, NY (US); Natesan Venkataraman, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 49 days.

(21) Appl. No.: 13/236,068

(22) Filed: Sep. 19, 2011

(65) Prior Publication Data

US 2012/0074528 A1    Mar. 29, 2012

Related U.S. Application Data

(60) Provisional application No. 61/385,714, filed on Sep. 23, 2010.

(51) Int. Cl.
| | | |
|---|---|---|
| *H01L 29/04* | (2006.01) | |
| *C30B 28/06* | (2006.01) | |
| *C30B 29/06* | (2006.01) | |
| *C30B 11/00* | (2006.01) | |
| *C30B 13/24* | (2006.01) | |

(52) U.S. Cl.
CPC .............. *C30B 11/002* (2013.01); *C30B 28/06* (2013.01); *C30B 29/06* (2013.01); *C30B 13/24* (2013.01)
USPC ................. 257/49; 257/50; 257/51; 257/64; 257/65; 257/70; 257/75; 257/77; 257/78; 257/E21.497; 438/166

(58) Field of Classification Search
USPC .......................................... 136/206, 243–265
See application file for complete search history.

(56) References Cited

U.S. PATENT DOCUMENTS

| | | | |
|---|---|---|---|
| 2,935,386 A | | 5/1960 | Selker |
| 3,597,524 A | * | 8/1971 | Schreiner et al. ............... 174/42 |
| 5,296,089 A | | 3/1994 | Chen et al. .................... 156/620 |

(Continued)

FOREIGN PATENT DOCUMENTS

| | | |
|---|---|---|
| EP | 0071731 | 6/1982 |
| WO | 2009/108358 | 9/2009 |

OTHER PUBLICATIONS

Eyer, et al., "Silicon Sheets for Solar Cells Grown from Silicon Powder by the SSP Technique", Journal of Crystal Growth, 104 (1990), pp. 119-125.

(Continued)

*Primary Examiner* — Steven Loke
*Assistant Examiner* — Cuong B Nguyen
(74) *Attorney, Agent, or Firm* — Michael W. Russell

(57) ABSTRACT

A method of treating a sheet of semiconducting material comprises forming a sinterable first layer over each major surface of a sheet of semiconducting material, forming a second layer over each of the first layers to form a particle-coated semiconductor sheet, placing the particle-coated sheet between end members, heating the particle-coated sheet to a temperature effective to at least partially sinter the first layer and at least partially melt the semiconducting material, and cooling the particle-coated sheet to solidify the semiconducting material and form a treated sheet of semiconducting material.

14 Claims, 4 Drawing Sheets

(56) References Cited

U.S. PATENT DOCUMENTS

| | | | |
|---|---|---|---|
| 5,614,447 A | 3/1997 | Yamaga et al. | 437/247 |
| 2002/0023894 A1 | 2/2002 | Rossi | 216/2 |
| 2007/0254161 A1 | 11/2007 | Wirth et al. | 428/426 |
| 2009/0019348 A1 | 1/2009 | King | 715/205 |
| 2010/0295061 A1* | 11/2010 | Sachs et al. | 257/77 |

OTHER PUBLICATIONS

Robinson, et al., "Large area recrystallization of polysilicon with tungsten-halogen lamps", Journal of Crystal Growth, 63, (1983), pp. 484-492.

Yablonovitch, et al., "Ribbon-to-ribbon float zone single crystal growth stabilized by a thin silicon dioxide skin", American Institute of Physics, 45(1), pp. 63-65, Apr. 11, 1984.

* cited by examiner

TECHNIQUE TO MODIFY THE MICROSTRUCTURE OF SEMICONDUCTING MATERIALS

CROSS-REFERENCE TO RELATED APPLICATION(S)

This application claims the benefit of priority under 35 U.S.C. §119 of U.S. Provisional Application Ser. No. 61/385,714 filed on Sep. 23, 2010, the content of which is relied upon and incorporated herein by reference in its entirety.

BACKGROUND

The present disclosure relates generally to methods of forming articles of semiconducting materials, and also to pre-treated semiconducting materials used in such methods.

Semiconducting materials are used in a variety of applications, and may be incorporated, for example, into electronic devices such as photovoltaic devices. Photovoltaic devices convert light radiation into electrical energy through the photovoltaic effect.

The properties of semiconducting materials depend on a variety of factors, including crystal structure, the concentration and type of intrinsic defects, and the presence and distribution of dopants and other impurities. Within a semiconducting material, the grain size and grain size distribution, for example, can impact the performance of resulting devices. By way of example, the electrical conductivity and thus the overall efficiency of a semiconductor-based device such as a photovoltaic cell will generally improve with larger and more uniform grains.

For silicon-based devices, silicon may be formed using a variety of techniques, which can be used to form a variety of shapes such as an ingot, sheet or ribbon. The silicon may be supported or unsupported by an underlying substrate. However, conventional methods for making supported and unsupported articles of silicon have a number of shortcomings.

Methods of making unsupported thin semiconducting material sheets, including silicon sheets, may be slow or wasteful of the semiconducting material feedstock. Unsupported single crystalline semiconducting materials can be produced, for example, using Czochralski or Bridgman processes. However, such bulk methods may disadvantageously result in significant kerf loss when the material is cut into thin sheets or wafers. Additional methods by which unsupported polycrystalline semiconducting materials can be produced include electromagnetic casting and direct net-shape sheet growth methods such as ribbon growth processes. These techniques tend to be slow and expensive. Polycrystalline silicon ribbon produced using silicon ribbon growth technologies is typically formed at a rate of only about 1-2 cm/min.

Supported semiconducting material sheets may be produced less expensively, but the semiconducting material sheet may be limited by the substrate on which it is formed, and the substrate may have to meet various process and application requirements, which may be conflicting.

Example methods for producing unsupported polycrystalline semiconducting materials using an exocasting process are disclosed in U.S. patent application Ser. No. 12/394,608, filed Feb. 27, 2009, U.S. patent application Ser. No. 12/466,143, filed May 14, 2009, and U.S. patent application Ser. No. 12/632,837, filed Dec. 8, 2009, the disclosures of which are hereby incorporated by reference.

As described herein, the inventors have now discovered additional methods by which supported and unsupported articles of semiconducting materials may be made. The disclosed methods may facilitate formation of semiconducting materials (e.g., exocast materials) having desirable attributes such as uniform thickness and a desired microstructure while reducing material waste and increasing the rate of production.

SUMMARY

In accordance with various exemplary embodiments of the disclosure are provided methods of treating a sheet of semiconducting material, comprising forming a sinterable first layer over each major surface of the sheet, forming a second layer over each of the first layers to form a particle-coated semiconductor sheet, placing the particle-coated sheet between end members, heating the particle-coated sheet to a temperature effective to at least partially sinter the first layer and at least partially melt the semiconducting material, and cooling the particle-coated sheet to solidify the semiconducting material and form a treated sheet of semiconducting material. The foregoing method of treating a sheet of semiconducting material may improve at least one of crystal grain structure and/or surface properties of the semiconducting material. By providing a particle coating that can encapsulate the sheet, the overall form factor of the sheet can be retained throughout the act of melting. In embodiments, the particle coating comprises multiple layers where each layer can be characterized by a distinct set of attributes.

The heating may comprise a single heating step wherein the entire sheet of semiconducting material is heated sufficiently to form a molten sheet, followed by a cooling step wherein the molten sheet is solidified in a direction substantially parallel to a shortest dimension of the molten sheet. In a further embodiment, the heating and cooling may each comprise a plurality of separate steps wherein, for example, in a first heating step, a surface of the sheet is locally heated to form a melt pool in the surface of the sheet and the melt pool is translated across the surface of the sheet by moving the heat source relative to the sheet. In a subsequent, second heating step, the entire sheet is heated sufficiently to form a molten sheet of semiconducting material, followed by a cooling step wherein the molten sheet is solidified in a direction substantially parallel to a shortest dimension of the sheet.

Other exemplary embodiments according to the disclosure relate to a pre-treated, particle-coated sheet of semiconducting material comprising a sheet of semiconducting material having a sinterable first layer formed over each major surface of the sheet, and a second layer formed over each of the first layers.

The disclosure thus relates to methods of making or treating articles of semiconducting materials and articles of semiconducting materials made and/or treated thereby. In the following description, certain aspects and embodiments will become evident. It should be understood that the invention, in its broadest sense, could be practiced without having one or more features of these aspects and embodiments. It should be further understood that these aspects and embodiments are merely exemplary and explanatory, and are not restrictive of the invention as claimed.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

DETAILED DESCRIPTION

Figure 1:
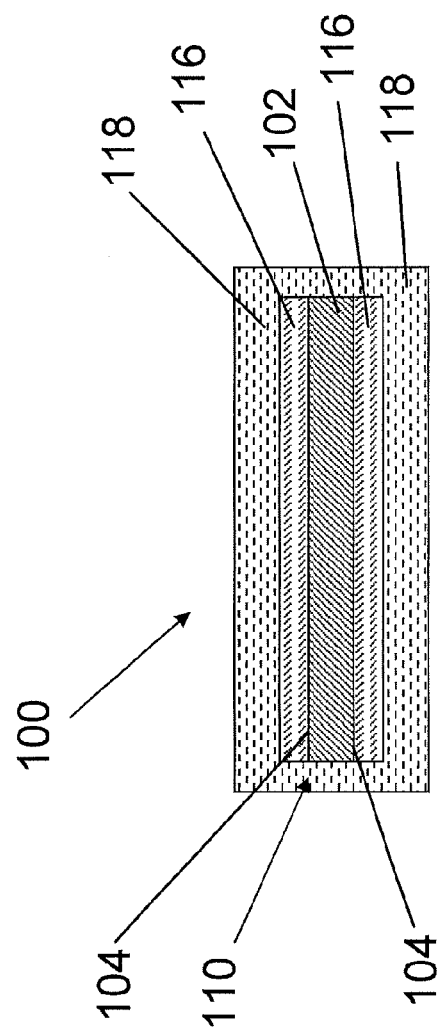
FIG. 1 is a schematic of a particle-coated semiconductor sheet according to one embodiment.

Reference will now be made to various exemplary embodiments, at least one example of which is illustrated in the accompanying figures. However, these various exemplary embodiments are not intended to limit the disclosure, but rather numerous specific details are set forth in order to provide a thorough understanding of the invention. It will be apparent to one skilled in the art that the invention may be practiced without some or all of these specific details and the disclosure is intended to cover alternatives, modifications, and equivalents. For example, well-known features and/or process steps may not have been described in detail so as not to unnecessarily obscure the invention. In the accompanying drawings, like or identical reference numerals are used to identify common or similar elements.

The present disclosure contemplates various methods for making a treated sheet of semiconducting material. The disclosed methods involve melting and recrystallizing a previously-formed sheet of semiconducting material in order to refine one or more sheet attributes. As would be appreciated by a skilled artisan, due to the relatively high surface tension of many semiconducting materials, for example, silicon, these materials have a natural tendency to minimize their surface energy upon melting and form a sphere. In several embodiments disclosed herein, a multi-layer particle coating is formed over one or both of the surfaces of the original sheet of semiconductor material in order to prevent balling up of the sheet while the sheet is molten.

In the various methods, a multi-layer particle coating is formed over opposing surfaces of the sheet to be treated. The particle coating comprises a sinterable first layer formed over each major surface of the sheet, and a second layer formed over each of the first layers.

An embodiment involves forming a sinterable first layer over each major surface of a sheet of semiconducting material, forming a second layer over each of the first layers to form a particle-coated semiconductor sheet, placing the particle-coated sheet between end members, heating the particle-coated sheet to a temperature effective to at least partially sinter the first layer and at least partially melt the semiconducting material, and cooling the particle-coated sheet to solidify the semiconducting material and form a treated sheet of semiconducting material. The acts of heating and cooling may be carried out according to one or more embodiments.

In one heating and cooling approach, the entire sheet of semiconducting material is heated to a temperature sufficient to melt the sheet, and then directionally cooled so as to solidify the molten sheet in a direction substantially parallel to a shortest dimension of the molten sheet.

In a second heating and cooling approach, a surface of the sheet of semiconducting material is initially heated locally in a first heating step to form a melt pool in the surface. The locally-heated region is then moved across the surface of the sheet so as to translate the melt pool across the surface. In a second heating step, the entire sheet of semiconducting material is heated to a temperature sufficient to melt the sheet, and then directionally cooled by so as to solidify the molten sheet in a direction substantially parallel to a shortest dimension of the molten sheet.

As illustrated schematically in FIG. 1, a particle-coated sheet of semiconducting material 100 includes a sheet of semiconducting material 102 having a multi-layer particle coating 110 formed over each major surface 104. The multi-layer particle coating 110 comprises a sinterable first layer 116 formed over each major surface 104, and a second layer 118 formed over each of the first layers 116.

The sheet of semiconducting material may comprise one or more materials that exhibit semiconducting properties, such as, by way of non-limiting example, silicon, germanium, gallium arsenide, and titanium dioxide, as well as alloys and compounds thereof. In various embodiments, the semiconducting material may be pure (such as, for example, intrinsic or i-type silicon) or doped (such as, for example, silicon containing an n-type or p-type dopant, such as phosphorous or boron, respectively).

The term "sheet of semiconducting material" includes solid forms having at least one substantially planar surface. The sheet of semiconducting material may have a thickness ranging from about 25 μm to about 5000 μm, such as, for example, from about 100 μm to about 300 μm, and a length and a width, independently of one another, ranging from about 75 ∞m to about 500 cm, such as, for example, from about 250 pm to about 250 cm, further such as, for example, from about 500 μm to about 15 cm.

An original sheet of semiconducting material may be formed by any method known to those skilled in the art. The sheet of semiconducting material may be, in at least one embodiment, a net-shaped silicon form, such as one made by an exocasting process as disclosed in common-owned U.S. Patent Application No. PCT/US09/01268, the entire contents of which being hereby incorporated by reference.

The original (i.e., as-cast) sheet of semiconducting material may multicrystalline and may not, in some embodiments, possess optimal crystal quality (e.g., size, distribution, orientation, defect density, surface properties, etc.) for its intended application. Prior to the acts of heating and cooling disclosed herein, the sheet of semiconducting material may comprise crystalline grains having an average grain size in a range of 20 microns to 5 cm. The pre-treated grains may be dendritic. As such, the original sheet may be further processed according to various methods described herein.

The multi-layer particle coating provides support during melting and recrystallization of the original sheet, which allows the sheet to maintain its shape despite undergoing solid-to-liquid and liquid-to-solid phase transformations. The flexibility and support provided by the multi-layer particle coating can respond to the mechanics and kinetics associated with the thermal cycling, which for a silicon semiconducting sheet include thermal expansion of the solid upon heating, an abrupt decrease in volume (−11%) upon melting, redistribution of molten silicon while in the liquid phase, an increase in volume upon freezing and, finally, thermal contraction of the solid upon cooling.

In embodiments, the first layers comprise a particle layer having an average particle size in a range of 20 nm to 150 microns (e.g., 50, 100 or 150 microns). The first layers can be formed in direct contact with the sheet of semiconducting material, and can be formed from a sinterable material such as silica, alumina, zirconia, yttria, and hafnia, and mixtures and compounds thereof, as well as vitreous forms thereof. The size of the particles used to form the first layers may be chosen to promote interparticle bonding at lower temperatures and/or at shorter times. In embodiments, the first layer may retain topographical details found in the unprocessed sheet and promote replication of such details in the processed sheet. Any suitable technique may be used to form the first layers, including spray coating or dip coating.

The first layers may form continuous layers over surfaces of the semiconducting sheet. An average thickness of each of the first layers may be in a range of 500 nm to 50 microns (e.g., 0.5, 1, 5, 10 or 50 microns). Alternatively, the first layers may be discontinuous such as patterned layers that are formed over only selected portions of the sheet.

In embodiments, the second layer also comprises a particle layer. The particles in the second particle layer can have an average particle size in a range of 20 microns to 1 mm (e.g., 20, 50, 100, 200, 500 or 1000 microns). The second layers can be formed in direct contact with the first layers, and can be formed from a material such as silica, alumina, zirconia, yttria, and hafnia, and mixtures and compounds thereof, as well as vitreous forms thereof. The size of the particles used to form the second layers may be chosen to increase the tendency of the second layer to retain an open and mechanically compliant structure that can accommodate the thermodynamics and kinetics associated with the acts of heating and cooling.

The second layer can assume various forms such as, by way of example, a particle bed, woven fabric, non-woven fabric such as a felt or veil made from fibers of the refractory materials, and sintered but not fully densified versions of any of the above alone or in combination. An average thickness of each of the second layers may be in a range of 500 microns to 5 mm. The first and second layers can be loosely packed particle layers each independently having a packing density of between about 20 and 80% of a theoretical density.

In embodiments, the particles in respective first and second layers exhibit distinguishable attributes (e.g., composition, particle size, particle size distribution) that may vary continuously or discontinuously (e.g., stepwise) through the thickness of the layers. Both the individual attributes and the attribute differences may be created, for example, by engineered mixing of particles prior to or during formation of the layers, or in situ as a result of settling or diffusion during formation of the layers, handling, heating, cooking, etc.

The dimensionality of the particles in each layer can affect particle packing prior to and during heating. Particle shape can also affect the mechanical integrity of the particle layer(s) during melting and recrystallization of the semiconductor material. As such, individual particles may be 1-, 2- or 3-dimensional (i.e., in the shape of fibers or platelets in addition to 3-dimensional particles). As an example, 1-dimensional particles can take the shape of whiskers or fibers, which can have an overall length, for example, ranging from 0.1 mm to 30 mm or more, and an aspect ratio (length/diameter) of 2 or more. As a further example, 2-dimensional particles can be characterized as platelets or discs, which can have an aspect ratio of 2 or more along two separate, mutually perpendicular axes. In embodiments, an average particle dimension (i.e., fiber diameter, platelet thickness or 3-dimensional particle diameter) can range from 20 to 150 microns. A particle size distribution with a particle layer may be unimodal, bimodal or multimodal.

The general habit of the particles may be characterized as smooth, faceted or sharp. Generally, particles having rough surface features will display a greater tendency to form interparticle bonds during heating.

In embodiments, particles in one or both of the first and second layers may be functionalized. Functionalized particles may include, for example dopants that can be incorporated into the semiconducting material during the heating and cooling. Dopants may include boron, phosphorus, gallium, etc. A concentration of one or more dopants, or other functional additive may range from 0.1 ppb to 3000 ppb. By way of a further example, functionalized particles may include gettering species that can getter contaminants from the molten semiconducting material during the heating and cooling. Example gettering species include halogens such as fluorine, which may be incorporated into the particles as dissolved ions. In a further example, the particles may include a barrier material (e.g., aluminum in silica particles) that can prevent contaminants from interacting with the semiconducting material. Additives may be used to promote or discourage sintering or interparticle bonding of the particles during the heating and cooling. Such additives may include, for example, mullite, zirconia, $B_2O_3$, silica soot, silica sols or silicones. Liquids such as water or alcohols may be combined with the particles in order to increase the green strength of the layers prior to heating.

The first and second layers can form a structural framework that confines the molten semiconducting material. Without wishing to be bound by theory, it is believed that within the multi-layer particle coating, the first layer (finer particles) loosely sinter into a porous layer that forms weak bonds with the surface of the semiconducting material via a thin oxide passivation layer that forms spontaneously on the surface upon exposure to air. The second layer comprises coarser particles that weakly bond to each other to form a highly porous scaffold or superstructure that also intermittently forms bonds to the first layer and provides flexible support.

In order to provide mechanical stability, the particle-coated semiconductor sheet can be placed between rigid end members during the heating cycle(s). Suitable end members include inert refractory materials such as silicon carbide, fused silica, alumina or mullite plates. An example plate thickness can range from 2 mm to 6 mm (e.g., 4 mm).

The end members are configures to exert a containment force on the respective first and second layers. The magnitude of the force can be determined by a skilled artisan working with the parameters of a particular system, but should be sufficiently large to maintain the original dimensions of the sheet throughout the acts of heating and cooling, yet sufficiently small so as to avoid intercalation or penetration of the molten semiconducting material into the particle layers. In embodiments, the direction of the force exerted by the end members is parallel to a thickness dimension of the sheet.

Methods by which a treated article of semiconducting material, for example a net-shaped silicon sheet (e.g., 15 cm×15 cm×200 microns), can be formed involve decoupling the initial creation of a net shape from one or more refinement steps that can be used to refine grain size, defect density, etc.

After forming a particle-coated semiconductor sheet and placing the particle-coated semiconductor sheet between supporting end members, the sheet is heated (and cooled) in one or more steps to form a treated sheet. During the heating steps the particle-coated semiconductor sheet is partially or entirely melted and then re-solidified such that the semiconducting material undergoes recrystallization. Following the acts of heating and cooling disclosed herein, the treated sheet of semiconducting material may comprise crystalline grains having an average grain size in a range of 50 microns to 5 cm. The treated grains may be substantially equiaxed. The treated sheet of semiconducting material can have a total thickness variability that is at least 50% less than a total thickness variability of the sheet of semiconducting material prior to the acts of heating and cooling.

In one embodiment, the semiconducting sheet may be partially or completely melted, followed by solidification in a direction substantially parallel to the shortest dimension of the melted sheet (i.e., thickness).

Without wishing to be bound by theory, it is believed that the directional solidification may, at least in part, be used to control the final microstructure (i.e., grain size, orientation, etc.) and defect density of the treated sheet of semiconducting material. Since both of these properties depend strongly on the solid-liquid interface shape and the solid-liquid interface velocity (i.e., solidification speed), by properly controlling the directional solidification rate, the treated sheet of semiconducting material may be grown with large columnar grains as well as low defect density.

In at least one embodiment, during directional solidification the solid-liquid interface remains substantially perpendicular to the shortest dimension of the melted sheet of semiconducting material. The solid-liquid interface may, for example, move from at least one surface of the molten sheet to the opposite surface, or vice versa, while remaining substantially perpendicular to the shortest dimension (i.e., thickness) of the sheet. In further embodiments, the solid-liquid interface may move at the same or varying speeds from at least one surface and at least one additional surface (e.g., directional solidification from two or more sides), regardless of the source(s) of the thermal energy. In at least some embodiments, it may be important to have as homogeneous a temperature distribution in the lateral direction as possible to ensure that the solid-liquid interface remains substantially perpendicular to the shortest dimension at any point during the directional solidification step.

An exemplary embodiment of the heating and directional solidification process described herein is shown in FIGS. 2A, 2B, 2C, and 2D. In the exemplary embodiment shown in FIG. 2A, a particle-coated sheet 100 of semiconducting material 102 is placed between support members 202, and the resulting assembly 200 is placed on an optional platen 204. An example platen is a high temperature ceramic material, which is shown in contact with a heat reservoir 300. The temperature of the heat reservoir 300 may be changed at a desired rate.

Figure 2A:
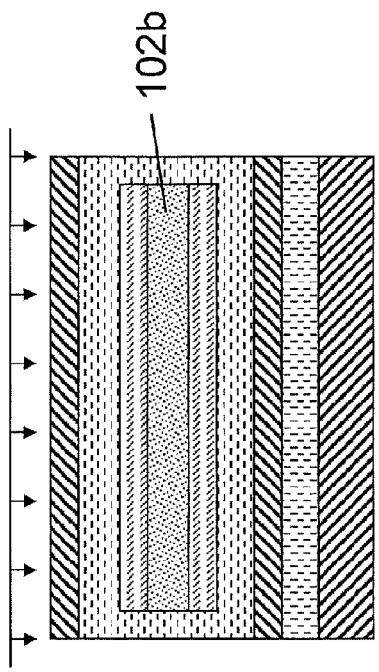
FIG. 2A-2D is a series of schematic illustrations showing a directional solidification process according to one embodiment.
Figure 2B:
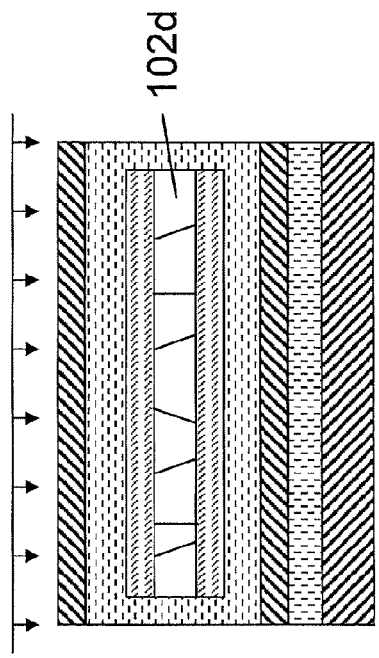
Figure 2C:
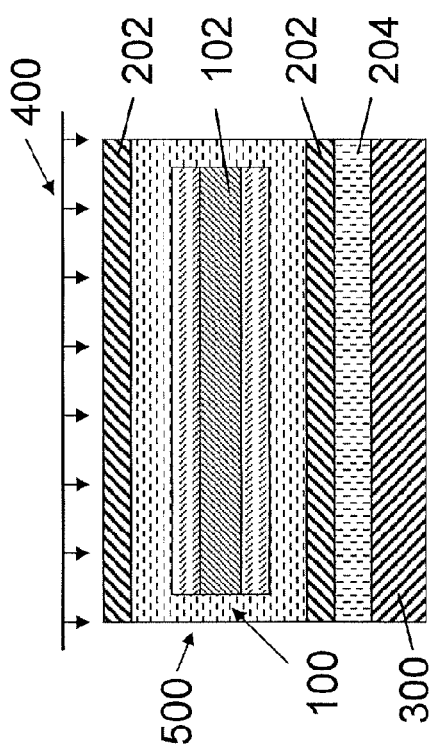

The heating and directional solidification process shown in FIGS. 2B and 2C may be applied to any particle-coated sheet of semiconducting material, and one of skill in the art would be able to readily determine what, if any, variations are necessary depending on, for example, the composition and dimensions of the sheet of semiconducting material, the properties desired in the treated sheet, and/or the nature of the heat source.

In the illustrated embodiment, a top heater 400 is placed above the assembly 500. The top heater 400 is adapted to completely melt the sheet of semiconducting material. The top heater 400 in FIG. 2B is set at a temperature higher than the melting point of the semiconducting material and the temperatures of both the top heater 400 and the heat reservoir 300 are held for a period of time sufficient to completely melt the entire sheet, although in other embodiments the semiconducting material 102 may be only partially melted. The melted sheet 102*b* is illustrated in FIG. 2B.

Figure 2D:
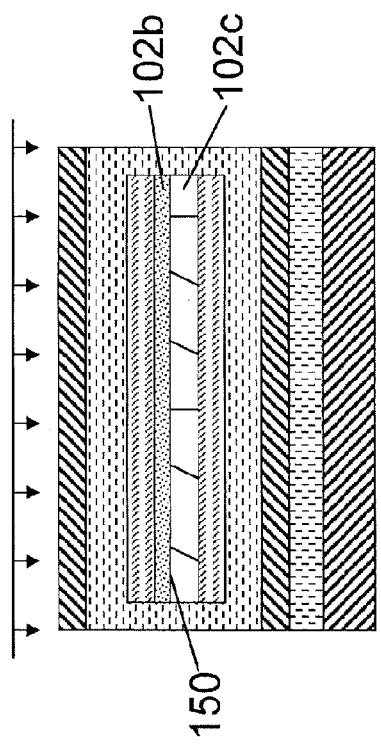

As shown in FIG. 2C, the temperature of the heat reservoir 300 may be subsequently decreased to directionally solidify the melted semiconducting material from the bottom towards the top, i.e., in a direction substantially parallel to the shortest dimension of the melted sheet. During directional solidification, solid-liquid interface 150 remains substantially perpendicular to the shortest dimension. The solid-liquid interface 150 separates a partially re-solidified sheet 102*c* from the melted sheet 102*b*. As shown in FIG. 2D, a treated, completely resolidified sheet of semiconducting material 102*d* is formed upon completion of the solidification.

Directional solidification may be initiated from the top surface and/or the bottom surface of the molten sheet. In an embodiment where solidification is from the bottom surface, as shown in FIG. 2C, directional solidification may be achieved by lowering the temperature of the heat reservoir 300, while also controlling a temperature of the heater 400.

In various embodiments, the solidification speed and direction may be precisely controlled and the solid-liquid interface may therefore likewise be controlled such that it grows at a velocity lower than the critical velocity for morphological instability. Without wishing to be bound by theory, it is believed that the formation of cellular interfaces and sub-grain boundaries substantially perpendicular to the shortest dimension of the melted sheet may be prevented or minimized by the directional solidification process described herein, thereby leading to higher quality grain structures. By maintaining the temperature gradient substantially parallel to the shortest dimension of the sheet, columnar grains may be grown substantially parallel to the shortest dimension. The columnar grains substantially parallel to the shortest dimension may minimize the interception of conducting species (e.g., holes and electrons) by inclined grain boundaries, thereby increasing the efficiency of devices comprising the treated sheet.

In various embodiments where high throughput is desired, a low solidification speed (about 100 microns/sec) may, in at least some embodiments, be achieved without compromising throughput by performing directional solidification as described herein. For example, while the solidification speed may be about 100 microns/sec, the solidification distance may also be relatively short, such as, for example, about 200 microns in the through-thickness direction such that a processing time of only about 2 seconds is needed. This example demonstrates that solidification at a relatively low speed can be achieved, while still maintaining a high throughput.

In a further embodiment, the semiconducting sheet can be first heated locally to form a melt pool in the surface sheet. The locally-heated region can then be moved across the surface of the sheet so as to translate the melt pool across the surface. After forming and translating a melt pool, the entire sheet of semiconducting material can be heated and melted in a second heating step, which includes directionally cooling the molten sheet in a direction substantially parallel to a shortest dimension of the sheet as disclosed above.

As used herein, the term "melt pool" refers to a volume of liquid semiconducting material formed on or within a sheet of semiconducting material, wherein the liquid material is formed by locally heating a solid sheet to a temperature effective to induce a solid-to-liquid phase transformation. The terms "melted" and "molten" and variations thereof are used herein interchangeably.

The formation and translation of a melt pool can facilitate zone melt refining (ZMR) of the semiconducting material prior to a second heating step that involves directional solidification. Aspects of the second heating step are disclosed above. In zone melt refining, only a small volume of the sheet is molten at any time and the molten zone is moved along the sheet (in practice, the sheet is pulled through a heater). As translation of the melt pool progresses, impure solid is melted at the leading edge of the melt pool, and a wake of purer material is solidified at the trailing edge of the melt pool. The impurities that are concentrated in the liquid phase are swept to a peripheral portion of the sheet. In an embodiment, after zone melt refining, a peripheral portion of the sheet can be removed prior to the second heating step.

In an embodiment, a translation rate of the melt pool can range from 100 microns/second to 10 mm/sec. A temperature gradient along a direction of translation of the melt pool can range from 10 to 1000° C./cm.

Figure 3:
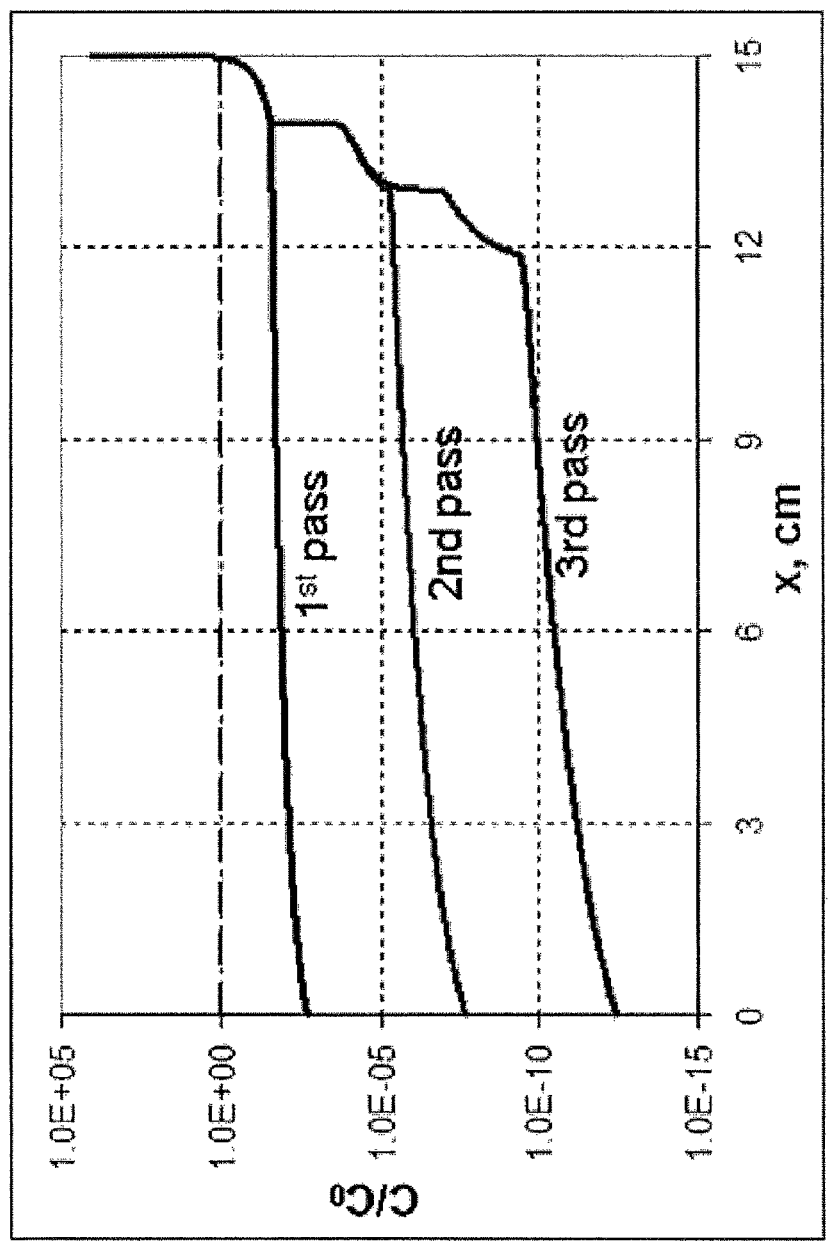
FIG. 3 is a segregation profile of aluminum in a silicon sheet following successive zone melt refining steps.

Normalized segregation profiles of aluminum impurities in a silicon sheet have been calculated after one, two, and three ZMR passes as shown in FIG. 3. In FIG. 3, $C_0$ is the initial concentration of aluminum and C is the theoretical concentration. The calculations suggest that it is possible to significantly segregate the aluminum atoms to one edge (in this case the right edge) of the silicon sheet, which leads to a substantial decrease in the aluminum concentration over much of the sheet area.

Localized heating and melting may be done using a hydrogen torch, where the area of the melted region is a function of the overall flame shape and temperature. The area of a melt pool may be varied from multiple square millimeters up to 10 square centimeters. Any focused heat source (radiative or convective/conductive) may be used to accomplish such localized melting and attendant solidification. It is also to be understood that the formation of a melt pool need not be a singular event. For example, multiple such pools may be applied to a sheet of semiconducting material simultaneously or in succession. Multiple simultaneously-formed pools may or may not overlap.

A heating and cooling step comprising zone melt recrystallization (ZMR) can serve as an intermediate impurity purification process between the multi-layer particle encapsulation and a final recrystallization process. As an integrated in-situ process, the present embodiment includes encapsulation of a semiconducting sheet, lateral scanning of a melt pool along a surface of the sheet, optional removal of edge material having a high impurity concentration, and complete melting of the still particle-coated sheet followed by vertical (i.e., through-thickness) resolidification.

The heat content of the molten sheet may be extracted in any fashion known to those of skill in the art. For example, in one embodiment, the heat flux into a top surface may be reduced in addition to or instead of increasing the heat flux out from a bottom surface in order to reduce the overall heat content. In another embodiment, the heat content of the molten sheet may be extracted by increasing a distance between the heat source and the sheet. In another embodiment, the heat content of the molten sheet may be extracted by moving the focal point of a localized heat source. In another exemplary embodiment, such as when the heat source comprises a flame, the extraction of the heat content may be performed by fanning the flame over a greater surface area of the sheet. In yet another embodiment, the heat content of the molten sheet may be extracted by at least one of reducing the temperature of the heat source, controlling the temperature of a platen if a platen is used, and actively cooling.

The term "treated sheet of semiconducting material" means an article of semiconducting material formed from a sheet of semiconducting material that has been subjected to the heating and cooling steps described herein. The treated sheet may retain the overall composition, geometry, shape, and/or form of the original sheet of semiconducting material.

According to various exemplary embodiments, the acts of heating and cooling disclosed herein can be practiced under ambient conditions, for example in air, or may be practiced in a controlled environment, such as in an enclosure (e.g., a glove box) containing, for example, argon, hydrogen, or mixtures thereof.

In various exemplary embodiments, the particle-coated sheet of semiconducting material may be heated by at least one heat source. For example, in one embodiment, the heating comprises exposing a bottom or top surface of the solid sheet to a heat source. In another embodiment, the heating comprises exposing a top surface of the sheet to a first heat source and a bottom surface of the sheet to a second heat source.

One of skill in the art will be able to determine heating techniques and parameters for heating (and cooling) the particle-coated sheet. In various exemplary embodiments, the heat source may be locally or globally applied and of sufficient thermal flux to partially or completely melt the sheet of semiconducting material. Any method of heating capable of providing sufficient heat flux may be used, such as, for example, any of the heating methods disclosed in U.S. patent application Ser. No. 12/156,499.

Example heating methods include combustion heat sources (e.g., torches), electrical discharge sources (e.g., plasma), infrared emission (e.g., resistance elements, bulbs) and combinations thereof. The heat source may, in various exemplary embodiments, be chosen from a heat reservoir (i.e., any material that can be heated, including, for example, a graphite block), a hydrogen/oxygen torch, a hydrogen/halogen torch (e.g., a hydrogen/chlorine torch), a tungsten inert gas (TIG) torch, optionally comprising a silicon dioxide enclosed tungsten electrode, an IR lamp, such as, for example, a halogen lamp and a laser array, an argon or helium plasma torch, an electrical discharge source, an arc lamp, and a carbon rod, such as an RF-heated carbon rod, which may optionally be enclosed to prevent carbon from entering or otherwise contaminating the semiconducting material, and combinations thereof.

The appropriate heating parameters for melting the sheet of semiconducting material may easily be determined by one skilled in the art for any particular embodiment. For example, one skilled in the art may choose the size and/or shape of the heat source to be commensurate with the size and/or shape of the sheet of semiconducting material, the desired size of the melt pool, or both. In addition, the flow rate of the heat and the length of time the heat is applied may be varied according to, for example, the size of the melt pool to be created, the heat flux to be controlled, and other factors which one of skill in the art practicing the invention can easily determine. The heat source may, in some embodiments, comprise multiple heat sources, such as, for example, multiple heat sources arranged in an array. The heat source may be fixed or movable. The heat source may also, in various embodiments, be combined, i.e., a "hybrid heat source." As a non-limiting example, a hybrid heat source may comprise an IR lamp combine with a torch or arc.

A suitable temperature for creating the melt pool or melting the entire sheet may be, for example, the melting temperature of the semiconducting material or higher. For example, the sheet of semiconducting material may be heated to a temperature ranging from about 900° C. to about 1650° C. or higher. By way of non-limiting example, the semiconducting material may be heated from about 1350° C. to about 1450° C. As a further non-limiting example, in one embodiment where the semiconducting material is silicon, it may be heated from 1414° C. to about 1650° C. One of skill in the art will appreciate that the suitable temperature may vary depending on factors such as, for example, the precise composition of the semiconducting material, the conditions under which it is heated, etc.

A desirable heating method and parameters for heating according to any particular embodiment may depend on, for example, the choice of semiconducting material, whether it is doped, whether partial or complete melting is desired, the desired properties of the treated sheet of semiconducting material, and other parameters that are well within the ability of those skilled in the art to determine and evaluate.

In another exemplary embodiment, it may be desirable to repeat the partial or complete melting and directional solidification steps one or more times. In at least one exemplary embodiment, a process of successive melting and directional solidification may be repeated as many times as desired and may further improve the crystal structure and/or surface properties of the treated sheet of semiconducting material.

Example

A polycrystalline silicon sheet (5 cm×5 cm×0.5 mm thick) formed by exocasting was dip-coated into a slurry comprising water and amorphous silica particle having a particle size in a range of 100 nm to 10 microns. The dip-coated sheet was dried to form a first particle layer over the silicon sheet.

The dip-coated silicon sheet having the first layer was then placed between opposing layers of high purity fused silica (HPFS) to form respective second particle layers over each first layer. The high purity fused silica included relatively coarse ground fused silica having a particle size varying from 100 microns to several millimeters.

The particle-coated semiconductor sheet was then placed between opposing silicon carbide plates, which provided mechanical support.

The supported particle-coated semiconductor sheet was placed into a pre-heated oven (1200° C.). The temperature of the oven was increased at a heating rate of about 15° C./min to a set point of 1430° C., held at 1430° C. for about 7 min, and then decreased at a cooling rate of about 40° C./min.

After cooling, the top SiC plate was removed, the exposed sand layer was brushed away, and the treated sheet was retrieved. Optionally, the treated sheet can be cleaned (e.g., etched) to remove any remaining silica particles from the surface. A suitable etchant is HF.

The treated sheet retained the shape of the original sheet, and was free of cracks. Some narrowing of the thickness at the periphery was observed, though no significant thinning or balling occurred.

Figure 4:
FIG. 4 is a cross-sectional electron backscattered diffraction (EBSD) map of an as-cast silicon sheet.
Figure 5:
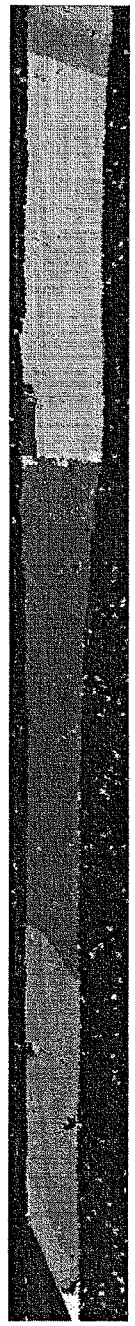
FIG. 5 is a cross-sectional electron backscattered diffraction (EBSD) map of a treated silicon sheet according to one embodiment.

FIGS. 4 and 5 show cross-sectional electron backscattered diffraction (EBSD) maps for the as-exocast and treated silicon sheets, respectively. The images reveal substantial grain growth in the treated silicon sheet relative to the as-exocast sheet. The grain size increased from an average size of about 100 microns to an average value of several millimeters.

Additional evidence of the microstructural evolution was provided using an etching technique. In this technique the re-crystallized sheet was etched using NaOH. The resulting facets revealed an increased grain size. The above example demonstrates microstructural alteration of the semiconducting sheet while maintaining the original form factor.

The impurity content (ppb by mass) for the original and treated semiconducting sheet is summarized in Table 1. The data show that the overall impurity level of the treated (i.e., recrystallized) sample is comparable to the levels measured in the as-cast sheet.

TABLE 1

Impurity content of as-cast and treated silicon sheets

| Impurity | As-cast | Treated |
| --- | --- | --- |
| Al | 61.0 | 12.0 |
| Al + Ca | 101.0 | 62.8 |
| Alkali | 195.5 | 30.4 |
| Alkaline Earth | 104.8 | 64.2 |
| Transition Metal | 40.4 | 192.0 |
| Other | 6.5 | 94.3 |
| Total | 408.3 | 392.9 |

Comparative Example

In a comparative example, a 2 micron thick PECVD $SiO_2$ layer was formed as a capping layer over both major surfaces of a polycrystalline silicon sheet of the type used in the Example. After heating and cooling using the thermal cycle described above, the semiconducting sheet exhibited grain growth, but also changed shape significantly as the silicon material underwent substantial redistribution between the capping layers. The comparative experiment revealed that the original roughness of the as-cast sheet prevented the $SiO_2$ capping layer from successfully retaining the shape of the molten silicon.

It will be appreciated that formation of the first and second layers can be automated using, for example, an automated dispensing and dip coating apparatus. In a similar vein, the apparatus for heating and cooling the particle-coated semiconductor sheet can be equipped to process multiple samples simultaneously during both the first heating step (localized heating) and second heating step (global heating).

Disclosed is a process of melting and recrystallizing a sheet of semiconducting material such as a polycrystalline silicon sheet where no capping layer is formed either prior to or during the recrystallization process. A multilayer particle coating is used in lieu of a dense capping layer.

Various exemplary methods of the disclosure may improve at least one of crystal grain structure and surface properties of a sheet of semiconducting material by forming a sinterable first layer over each major surface of the sheet of semiconducting material, forming a second layer over each of the first layers to form a particle-coated semiconductor sheet, placing the particle-coated sheet between end members, heating the particle-coated sheet to a temperature effective to at least partially sinter the first layer and at least partially melt the semiconducting material; and cooling the particle-coated sheet to solidify the semiconducting material and form a treated sheet of semiconducting material.

As used herein, the singular forms "a," "an" and "the" include plural referents unless the context clearly dictates otherwise. Thus, for example, reference to a "metal" includes examples having two or more such "metals" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another-r aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It is also noted that recitations herein refer to a component of the present invention being "configured" or "adapted to" function in a particular way. In this respect, such a component is "configured" or "adapted to" embody a particular property, or function in a particular manner, where such recitations are structural recitations as opposed to recitations of intended use. More specifically, the references herein to the manner in which a component is "configured" or "adapted to" denotes an existing physical condition of the component and, as such, is to be taken as a definite recitation of the structural characteristics of the component.

It will be apparent to those skilled in the art that various modifications and variations can be made to the present invention without departing from the spirit and scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A particle-coated semiconductor sheet, comprising:
   a sheet of semiconducting material having opposing major surfaces;
   a sinterable first particle layer formed over each major surface; and
   a second particle layer formed over each of the sinterable first particle layers, wherein the sinterable first particle layers comprise functionalized particles, said functionalized particles comprising a dopant selected from the group consisting of boron, phosphorus and gallium.

2. The particle-coated sheet according to claim 1, wherein the sinterable first particle layers comprise sinterable particles having an average particle size in a range of 20 nm to 100 microns.

3. The particle-coated sheet according to claim 1, wherein the sinterable first particle layers have packing density of between 20% and 80%.

4. The particle-coated sheet according to claim 1, wherein the sinterable first particle layers comprise vitreous silica.

5. The particle-coated sheet according to claim 1, wherein each of the sinterable first particle layers has an average thickness in a range of 500 nm to 50 microns.

6. The particle-coated sheet according to claim 1, wherein the second particle layers comprises particles having an average particle size in a range of 20 microns to 1 mm.

7. The particle-coated sheet according to claim 1, wherein the second particle layers comprises vitreous silica.

8. The particle-coated sheet according to claim 1, wherein each of the second particle layers has an average thickness in a range of 500 microns to 5 mm.

9. The particle-coated sheet according to claim 1, wherein the sinterable first particle layers arc formed in direct contact with the sheet of semiconducting material.

10. The particle-coated sheet according to claim 1, wherein the second particle layers have a packing density of between 20% and 80%.

11. The particle-coated sheet according to claim 1, wherein an average particle size of the sinterable first particle layers is less than an average particle size of the second particle layers.

12. The particle-coated sheet according to claim 1, further comprising rigid end members that are configured to exert a containment force on the respective sinterable first particle layers and second particle layers.

13. The particle-coated sheet according to claim 1, wherein the sinterable first particle layers comprises a material selected from the group consisting of silica, alumina, zirconia, yttria, and hafnia and mixtures thereof, and the second particle layers comprises a material selected from the group consisting of silica, alumina, zirconia, yttria, and hafnia and mixtures thereof.

14. The particle-coated sheet according to claim 1, wherein the sinterable first particle layers comprise a gettering species.

* * * * *